United States Patent
Tang et al.

(10) Patent No.: US 7,033,647 B2
(45) Date of Patent: Apr. 25, 2006

(54) METHOD OF SYNTHESISING CARBON NANO TUBES

(75) Inventors: Xinhe Tang, Vienna (AT); Klaus Mauthner, Vienna (AT); Ernst Hammel, Vienna (AT); Hans Löschner, Vienna (AT); Elmar Platzgummer, Vienna (AT); Gerhard Stengl, Wernberg (AT)

(73) Assignees: Electrovac, Fabrikation Elektrotechnischer Spezialartikel Gesellschaft M.B.H., Klosterneuburg (AT); IMS-Ionen Mikrofabrikationas Systeme, Vienna (AT)

( * ) Notice: Subject to any disclaimer, the term of this patent is extended or adjusted under 35 U.S.C. 154(b) by 90 days.

(21) Appl. No.: 10/301,317

(22) Filed: Nov. 20, 2002

(65) Prior Publication Data
US 2006/0068096 A1    Mar. 30, 2006

(30) Foreign Application Priority Data
Dec. 12, 2001  (AT) ............................. A 1947/2001

(51) Int. Cl.
C23C 16/26 (2006.01)
C23C 16/48 (2006.01)
D01F 9/127 (2006.01)

(52) U.S. Cl. ............... 427/533; 427/551; 427/552; 427/585; 427/595; 427/249.1; 427/903; 423/445 B; 423/447.1; 423/447.3

(58) Field of Classification Search ............ 427/551, 427/552, 585, 595, 77, 78, 249.1, 255.7, 427/256, 258, 261, 265, 282, 903, 533; 423/445 R, 423/445 B, 447.1, 447.2, 447.3; 118/723 FI; 977/DIG. 1
See application file for complete search history.

(56) References Cited

U.S. PATENT DOCUMENTS

| | | | | |
|---|---|---|---|---|
| 4,876,112 A * | 10/1989 | Kaito et al. | ................ | 438/674 |
| 5,104,684 A * | 4/1992 | Tao et al. | .................... | 427/526 |
| 5,192,393 A * | 3/1993 | Muranaka et al. | .......... | 427/582 |
| 5,209,916 A | 5/1993 | Gruen | | |
| 5,342,448 A * | 8/1994 | Hamamura et al. | ..... | 118/723 FI |
| 5,773,834 A | 6/1998 | Yamamoto et al. | | |
| 6,232,706 B1 * | 5/2001 | Dai et al. | .................... | 313/309 |
| 6,283,812 B1 * | 9/2001 | Jin et al. | ....................... | 445/24 |
| 6,420,092 B1 * | 7/2002 | Yang et al. | ................. | 430/311 |
| 6,457,350 B1 * | 10/2002 | Mitchell | ...................... | 73/105 |
| 6,486,480 B1 * | 11/2002 | Leung et al. | .......... | 250/492.21 |
| 6,504,292 B1 * | 1/2003 | Choi et al. | .................. | 313/310 |
| 6,787,122 B1 * | 9/2004 | Zhou | ....................... | 423/447.1 |

(Continued)

FOREIGN PATENT DOCUMENTS

EP    1 059 266 A2    12/2000

(Continued)

OTHER PUBLICATIONS

Biro, L.P. et al. "AFM and STM investigation of carbon nanotubes producted by high energy ion irradiation of graphite" Nuclear Instruments and Methods in Physics Research B 147 (1999) pp. 142-147.

*Primary Examiner*—Timothy Meeks
*Assistant Examiner*—Wesley D. Markham
(74) *Attorney, Agent, or Firm*—Merchant & Gould P.C.

(57) ABSTRACT

Method of synthesizing carbon nano tubes (CNTs) on a catalyst layer formed on a support member, by catalytic deposition of carbon from a gaseous phase, whereby an ion beam is used prior to, during, and/or after formation of the carbon nano tubes for modifying the physical, chemical, and/or conductive properties of the carbon nanotubes.

28 Claims, 10 Drawing Sheets

U.S. PATENT DOCUMENTS

| | | | |
|---|---|---|---|
| 2001/0009693 A1* | 7/2001 | Lee et al. | 427/249.1 |
| 2002/0086526 A1* | 7/2002 | Gavish | 438/653 |
| 2003/0044519 A1* | 3/2003 | Takai | 427/77 |
| 2004/0110128 A1* | 6/2004 | Hannah | 435/6 |

FOREIGN PATENT DOCUMENTS

| | | |
|---|---|---|
| EP | 1 059 266 A3 | 12/2000 |
| EP | 1 061 041 A1 | 12/2000 |
| EP | 1 115 135 A1 | 7/2001 |
| EP | 1 134 304 A2 | 9/2001 |
| JP | 6-184738 | 7/1994 |
| JP | 11-106208 | 4/1999 |
| JP | 11-255510 | 11/1999 |
| JP | 11-310406 | 11/1999 |
| JP | 11-310408 | 11/1999 |
| JP | 11-349307 | 12/1999 |
| WO | WO 99/43613 | 9/1999 |
| WO | WO 00/30141 | 5/2000 |
| WO | WO 00/76912 | 12/2000 |
| WO | WO 01/91922 A2 | 3/2001 |
| WO | WO 01/94658 A3 | 12/2001 |
| WO | 02/080186 | 10/2002 |
| WO | WO 02/103737 A2 | 12/2002 |

\* cited by examiner

METHOD OF SYNTHESISING CARBON NANO TUBES

CROSS-REFERENCE TO RELATED APPLICATIONS

Not Applicable

STATEMENT REGARDING FEDERALLY SPONSORED RESEARCH OR DEVELOPMENT

Not Applicable

INCORPORATION-BY-REFERENCE OF MATERIAL SUBMITTED ON A COMPACT DISC

Not Applicable

FIELD OF THE INVENTION

The invention relates to a method of synthesising carbon nano tubes (CNTs) on a catalyst layer formed on a support member, by catalytic deposition of carbon from a gaseous phase.

BACKGROUND OF THE INVENTION

Carbon nano tubes are known for their conductive or semiconductive properties due to the elongated tubulous structure. They are used especially in the field of industrial technology. The plurality of industrial applications of CNTs shows the need for improving the production process to obtain higher specific quality at increased quantities.

A number of methods synthesising vertically aligned CNTs are known from prior art. The majority of synthesis comprise a formation of a catalyst layer on which CNTs are developed. Popular methods obtaining such catalyst layer are sputtering, deposition processes, such as electron beam deposition, thermal deposition and the like. Preferred processes for growing CNT thereon include arc discharge, laser vaporisation, gas phase synthesis, CVD (Chemical vapor deposition) method, which include thermal CVD method, plasma CVD and the like.

Recent ambitions show that CNTs are developed on defined local areas on the catalyst layer to obtain vertically aligned nano tubes, by reasons of which a formation of such local areas has to be performed prior to the development of the carbon nano tubes.

The EP 1 059 266 A1 describes a method of synthesising carbon nano tubes where a catalyst layer comprising the catalytic metal particles is obtained by thermal deposition, sputtering or electron beam deposition. Local isolated catalytic metal particles from the metal catalyst layer are subsequently formed by etching the catalyst layer. Another possibility for obtaining isolated particles is the use of photolithography. Thereby, the catalyst layer is coated with photoresist and subjected to exposure and development processing to form a nanosized photoresist pattern which is used as an etching mask to form the isolated catalytic particles. The size and the density of particles can be controlled by controlling the size and density of the photoresist pattern. Growing the nano tubes is performed by thermal chemical vapor deposition in which a carbon source gas is supplied to a thermal CVD apparatus to form carbon nano tubes.

When electron beam deposition is used for obtaining a catalyst layer the actual deposition does not take place on the support member on which the electrons are impacting. The electron beams are used to evaporate particles from the surface of metal catalyst which are then deposited as catalytically active particles on the support member. The formation of a catalyst layer can not be performed directly on the support member.

Preparing an existing catalyst layer by the use of electron beams, in particular in relation to photolithographical methods, especially the exposure, results in high impact depths on the surface of the catalyst layer. This does not often give a favourable result because the impact of electrons might easily damage the catalyst and additional procedural steps are necessary. This clearly is a significant economic disadvantage when mass production is required.

Etching methods which are preferably used in industrial mass production in the field of nano technology are time consuming processes since a number of procedural steps are needed for the preparation of a catalyst layer. Furthermore, additional substances and/or materials are required in order to perform such preparations. This can easily cause detriments to the catalytic particles and a proper synthesis of a CNT subsequent to the preparation of a catalyst layer is not satisfying. It might even result in hindering the entire process of synthesising CNTs. These factors, in particular the time consuming and cost factor, play an important role in industrial production.

Therefore, it is an object of the present invention to provide an improved method of synthesising carbon nano tubes which limits or avoids the above mentioned problems and simplifies the entire process. A main object of the present invention is to gain the controlled synthesis of CNT by reducing and even omitting procedural, i.e. preparatory steps. Moreover, it is an object of the present invention to obtain a method which provides the control and the influence of the CNT during and/or after the synthesis without additional means or apparatuses.

BRIEF SUMMARY OF THE INVENTION

The object of the invention is achieved by a method of synthesising CNT on a catalyst layer formed on a support member, by catalytic deposition of carbon from a gaseous phase, whereby an ion beam is used prior to, during and/or after formation of said carbon nano tubes for modifying the physical, chemical and/or conductive properties of said carbon nano tubes. Synthesising CNTs by performing this method is advantageous due to its high procedural flexibility. The use of ion beam shows a variety of applications which also comprises the formation of the catalyst layer on a support member, as well as a further preparation thereof. Thus, the subsequent in-situ growth of nano tubes on the catalyst is provided in a highly controlled manner. When forming the catalyst, it is preferable, that ion beam is used with regard to catalytically active particles. This is advantageous, since a deposition may be performed directly on the support member without the need of any additional means. In relation to preparatory purposes of a catalyst layer, irrespective of its formation, the application of ion beam is advantageous since the impact of ions on the surface of the catalyst layer does not cause high impact depths thereon and, thus, no detriments to the surface and/or the catalytical particles thereof. Further, preparing a catalyst layer prior to the development of CNTs by the use of ion beam may comprise forming defined (isolated) local areas of catalytical active particles on said layer or even single catalytical active particles, thus providing control of the subsequent growth of CNTs, in particular in relation to their vertical alignment. Such a control may also be obtained when ion beam is used during the growth of CNTs, thus physical, chemical and/or conductive properties of said CNTs may be modified. After formation of carbon nano tubes the application of ion beam is preferable, because already developed CNTs may be easily altered according to need. Thus, physical, chemical and/or conductive properties of said carbon nano tubes can be enhanced in a very simple and rapid manner.

In the following the term "carbon nano tubes" is understood to refer to variants of carbon nano tubes which encompass nanofibres. Since the mechanism of growth is the same, the variants include variants showing single walls or poly walls or may be of a fishbone type.

When preparing an existing catalyst layer by the use of ion beam, irrespective to its formation, it is advantageous that it has a thickness in the range of 0.1 nm to 500 nm, preferably 0.5 nm to 30 nm.

A preferred feature of the invention is that the ion beam is guided by a diverting member and/or a focussing member. Hence, a control of the beam is provided, first of all ensuring the precise direction of the beam pointing to the support member and secondly defining the exact position of bombardment. For such a proper guidance of the ion beam, it is advantageous that said members are located at various positions apart from the support member. It may well be that the guiding members are able to be inclined or declined during the use of the ion beam. It should be mentioned here that the general position of said diverting member and/or the focusing member is in a certain distance to the support member on which CNTs subsequently are grown.

When controlling the beam it is advantageous that a stencil mask is used. It is preferable that the mask has a defined pattern of structure openings through which the beams are able to pass. The presence of such a mask has the advantage of obtaining the defined pattern on the support member, whether or not the catalyst layer is to be formed or the support member is already coated with a catalyst layer. Thus, desired isolated catalytically active particles or areas may be defined on the surface of said layer where the CNTs are subsequently grown. It is favourable that the stencil mask is situated between the beam source emitting the ion beam and said support member, preferably in a certain distance of both. Further, is most advantageous when such mask is replaceable by another mask having a different pattern of structure openings. It may well be that stencil masks having various patterns of structure openings are provided. Consequently, guiding the ion beam, especially in relation to possible variations of forming patterns of defined areas of catalytically active particles or even single catalytically active particles, can be performed more easily and rapidly by use of a stencil mask.

When a stencil mask is used, it is advantageous that a demagnifying ion optical system with a demagnification factor between 4 and 400, preferably 8 to 100 is used. Preferably, the stencil mask is located within said system, above the support member, thus being able to create an image on the support member or on the catalyst layer. Further, the image can be projected precisely within sub nanometers, which is most advantageous when forming single isolated catalytically active particles. For that purpose, the demagnifying ion optical system may comprise a system known in the art.

It is advantageous that the ion beam comprises a plurality of said beams, the plurality of sub-beams being controlled by a multi-beam ion optical system. An application of said system is preferred in combination with the use of a stencil mask, mentioned above, and the use of already described demagnifying ion optical system. By an application of said features favourable results of defined nanosized catalytic metal particles can be gained. It may comprise a lithographical process.

According to another feature of the invention with regard to a controller an electronically controlled beam source emitting said ion beam is used. For such beam source common electronic controllers may be used. A beam source of such a kind provides a simple way of guiding the ion beam since no additional means or members, such as a diverting member or a focussing member, for instance a stencil mask or the like, are needed in the apparatus, in which the method according to the invention is performed. It may well be that a combination of the above mentioned features of the invention are applied, especially in relation to the multi-beam ion optical system. Hence, a pattern, i.e. an ion image, can be projected on the support member in a simple and exact way.

It is advantageous that the ion beam comprises particles or molecules selected from the group consisting of catalytically active particles, preferably Co, Ni, Fe; gases, preferably He, H, Ar, Xe, Kr, O or doping agents As, P, B, Ag, Au, Pt, Pd, as well as mixtures thereof. Generally, it is well known that catalytic activity for the synthesis of carbon nano tubes is best provided by metals, such as Co, Ni, Fe or mixtures thereof. Due to the different properties of molecules, such as size and density, they may be selected depending on the way of performing the method according to the invention. Additionally, whether the ion beam is used prior to, during and/or after formation of said carbon nano tubes, different molecules and/or gases may be selected. For instance, when depositing catalytically active particles directly on the support member, the selection of molecules and/or gases may be distinct from the choice for developing catalytically active centres on an existing catalyst layer. Most preferably, the ion beam comprises any of the above mentioned elements or mixtures thereof and a gaseous phase of the above mentioned gases is present. Above mentioned features, such as the stencil mask, multi-beam optical system and the like, may well be applied in order to achieve a proper control of the ion beam comprising said elements. When ion beam is used during the formation of CNTs or after their growth, selected elements, such as As, P, B, Xe, Au, Pt, Pd, as well as mixtures thereof are preferably used, irrespective of their way of transport onto the catalytically active particles. Such elements may, preferably, be present in a gaseous phase or any other form, and the use of ion beam induces chemical reactions for their transport. When such elements are present and ion beam is applied, a modification and/or alteration of the properties of an already existing catalyst layer may easily be achieved in order to provide an influence of the subsequent in situ growth of carbon nano tubes and even to their further development. The application of P, for instance, is known in the art, as having a limiting effect of the catalytic activity. It may hinder or even block the catalytical activity in relation to the synthesis of CNTs. Said elements therefore are causing contaminations in/on the catalyst. It is also advantageous that such contaminating elements are used when carbon nano tubes are already developed in order to obtain a modification of said nano tubes, in particular to influence the electrical properties of particular nano tubes. A different example is Pd, which is able to enhance the surface energy of areas on a catalyst layer constituted by the presence of uneven surfaces, such as rims or ridges, thus improving development of carbon nano tubes.

Another preferred feature of the invention is that the catalyst layer comprises a metal catalyst layer. In relation to this it is most preferable that ion beam is used prior to the formation of the CNT. It is desirable that the catalytic activity is then developed out of the metal catalyst by the use of ion beam. Thus, a definition of isolated catalytically active particles may be performed in a rapid manner, irrespective what particular kind of element, mentioned above, is applied. Again, it may well be that for this purpose control guiding means, as already described, are applied.

A further advantageous feature according to the invention is that prior to the formation of said CNTs the catalyst layer is deposited on the support member by ion beam deposition. For that purpose, it is preferable that ion beam or a plurality of sub-beams, comprise catalytic material, such as Co, Ni, Fe or mixtures thereof. Thus, the ion beam is simply used as a transport medium for said particles, in order to be deposited directly on the support member. When the particles reach the surface of the support member, Van der Waals forces are coming into effect resulting in adhasion of said particles on the support member. It is advantageous, for the purpose of ion beam deposition, that a guiding member, such as a stencil mask having a predetermined pattern of structure openings is supplied. Further, it is preferable that demagnifying ion optical system is provided to obtain precise deposition of the metal particles onto the support member. Optionally, the beam comprising the catalytic material may be guided by an electronically controlled beam source. Ion beam deposition according to the invention therefore provides the possibility of direct and precise formation of catalytically active particles on the support member on which the CNTs can then be grown. The formation of catalytically active particles include the formation of isolated catalytically active particles, areas of catalytically active particles, and an entire catalyst layer comprising said particles. The direct deposition on the surface of the support member provides an immediate subsequent growth of the CNTs and additional preparations to obtain said CNTs can be omitted.

It is advantageous that prior to formation of said CNTs the catalyst layer is formed from a gaseous phase comprising catalyst particles, preferably an organometallic gas jet, and deposited on the support member by controlled ion beam induction, and CNTs are then grown on said catalyst layer. Ion beam induction according to the invention may be understood as ion beam, in particular ion beamlets, coming into contact with catalytic particles being present in the gaseous phase thereby inducing the chemical reaction wich results in the decomposition of the gas followed by the deposition of the residuals (the catalytically active particles) on the support member. Hence, the subsequent growth of carbon nano tubes is controlled. This may be obtained by the use metals such as Fe, Co, Ni or mixtures thereof. Likewise, it is desirable that the ion beam comprise gases selected from the group of gases mentioned above, most preferable $Ar^+$. Further, the control may be achieved by the additional use of a focussing member, diverting member, such as a stencil mask, a demagnifying ion optical system and a multi-beam ion optical system, or a controller being an electronically controlled beam source emitting said beam.

According to another feature of the invention it is advantageous that prior to the formation of said CNTs the catalytic activity of the catalyst layer is at least partially enhanced by an ion beam and CNTs are then grown on the active centers of the catalytic layer. The active centers are to be understood of having catalytic active properties for the synthesis of CNTs. They may be in form of local areas of catalytic active particles as well as in form of individual, separate metal particles. Thus, the the CNT immediately grown on said active centers may be controlled, in particular their physical and/or conductive properties. For such a purpose, again already described features according to the invention, such as a stencil mask with a demagnifying ion optical system, a multi-beam ion optical system or in the alternative a controller being an electronically controlled beam source emitting said beam, may be used.

Similarly, prior to the formation of said carbon nano tubes it is advantageous that the catalytic activity of a catalyst layer is at least partially decreased by an ion beam. By the way of this, local active centres of said layer may be defined resulting in an isolation of local areas showing minor catalytical activity. A negative image or pattern of ions enhancing or depleting the catalyst may be created. Thus, CNTs then grown thereon may be controlled, in particular in relation to their vertical aligned growth. As already mentioned above, according to the distribution of structure openings of the stencil mask—when such feature is applied—the pattern or image is projected onto the catalyst layer.

Likewise, an image may be projected on a catalyst with the difference that the bombarded areas are at least partially activated by an ion beam and CNTs are then grown on the active centres of the catalyst layer in a controlled manner. When activating catalytical particles of the catalyst layer by the use of ion beam it is favourable that said layer comprises a metal catalyst layer.

In relation to this it is favourable that the catalyst layer comprises an oxidised metal catalyst, which is at least partially reduced and activated by a beam comprising $H^+$-ions, and carbon nano tubes are then grown on the defined active centres of the catalyst layer. $H^+$-ions being subject of beam bombardment induces reduction of the irradiated areas within the layer thus creating the active centres required to form the nano tubes. Such catalytic oxidised layer may comprise metal oxides of elements, such as Fe, Ni, Co or combinations thereof. When irradiation of ion beams takes place on the layer by applying the features mentioned above, namely the guiding member such as a stencil mask having a specified pattern of the structure openings, the pattern of said guiding member is preferably projected to the layer.

In an alternative feature of the invention the catalyst is coated with catalytically non-active materials, in particular a polymer, which is, prior to the formation of said CNTs, at least partially removed by an ion beam and carbon nano tubes are then grown on said active centres of the catalyst. According to this feature of the invention a bombardment by ions may cause partial activation or complete activation. The local active centres or patterns may again be defined by use of guiding members and the demagnification optical system. Due to different properties of the chemical elements, such as size, mass and energy,—which may be selected—different impacts on the catalyst layer are caused, thus, resulting in different ranges of catalytical activity. Thus, even with a coating of the catalyst layer by a layer comprising non-active materials, such as a polymer layer, the use of ion beams comprising elements of a particular size and energy causes accurant activation of the catalyst. It may well be that, in such a case, the polymer layer is subjected to exposure for the defining a negative image on said layer and postexposure development of nano tubes is performed. Thereby, the remnants of the treated layer are removed in order to be able to perform the synthesis of CNTs. Such a removal may be performed in various ways. It may be that ion beam is used or etching methods, for instance using alcohol or an alcalic medium, are applied. Other, similar methods may be performed which provide a simple and rapid removal of the catalytically non-active layer. Hence, postexposure development of nano tubes may be understood in a development of the negative tone.

Another feature according to the invention is the partial deactivation performed by ion beam. In particular, prior to the formation of carbon nano tubes the catalyst layer is partially deactivated by an ion beam and carbon nano tubes are then grown on the remaining active centres of said catalyst layer. When CNTs are subsequently grown on the remaining centres, their pattern according to which they grow resembles a "negative" image of pattern created by ion beam bombardment in said catalyst layer. That means that ion beam is used for the definition of inactivated areas on said layer. The residuals of the layer are not affected by the ion beam which means that they still show catalytical activity and carbon nano tubes are able to grow thereon. Partial deactivation may be possible depending on the selection of the kind of ion beam, which is the selection of a particular element with its particular characteristics, such as mass, size and energy, as already pointed out above.

In relation to this it is advantageous that the catalyst layer comprises active metal catalyst which is partially oxidised and deactivated by a beam comprising $O^{2+}$-ions. The application of $O^{2+}$ ions is performed in a similar way as the application of $H^+$-ions described above. An oxidation, in particular an oxidation of an active metal catalyst layer leads to the effect of an at least partial deactivation of the catalytic activities of the respective areas.

According to the invention the ion beam may be used during the formation of carbon nano tubes whereby the direction of growth of said CNTs is influenced by partial polarisation of the surrounding surface by an ion beam. Due to such polarisation carbon nano tubes may be influenced in such a way that the subsequent growth of the particular carbon nano tubes is changing towards a direction different from the direction of initial growth. This alternative feature according to the invention may be performed when the direction of growth of CNTs is not satisfying and a modification of their growth is desired. In correspondence with other features of the invention, as already pointed out, the beams and subsequently the development of carbon nano tubes may be controlled by the use of a stencil mask with a demagnifying ion optical system or, alternatively, by a direct control of said ion beam, such as the use of an electronically controlled beam source. In addition, a multi-beam ion optical system—when ion beam is comprising a plurality of sub-beams—may be supplied.

In order to exploit semiconductive properties of carbon nano tubes, it is advantageous that said CNTs are doped by an ion beam. Doping particles include ions which are able to influence electric conductivity. Preferably, such elements comprise As, B, Ag, Au, Pt, Pd, P or mixtures thereof. Dotation may be performed by the application of one of the features according to the invention already described, for instance ion beam deposition or ion beam induced deposition. This comprises either a direct transport and implantation of the foreign ion by the ion beam, or altenatively, a gaseous phase comprising said foreign particles which desposition is induced by the beam. When selecting one of these options according to the invention it has to be understood that a control, i.e. guidance of ion beams in order to modify the conductive properties of developed carbon nano tubes may be performed in correspondence to the features according the invention. It may be that a stencil mask and a demagnifying ion optical system is applied. Alternatively, an electronically controlled beam source is used. Desirably, the ion beam comprises sub-beams being controlled by multi-beam ion optical system. Thus, precise positioning, i.e. placement of the foreign ion with regard to depletion or even destruction of a CNT is obtained. Moreover, it is possible that a nano tube transistor is developed by such application of ion beam.

Another preferred feature according to the invention comprises milling of carbon nano tubes by the use of an ion beam. This feature is advantageous when controlling the thickness of the walls of said carbon nano tubes is desired. In relation to this purpose it is preferable that the ion beam is controlled in an exact manner by applying a controller according to the features of the invention, since undesired detriment to adjacent carbon nano tubes which are not to be milled, may be omitted.

It is advantageous that after formation of carbon nano tubes said tubes are decapped by an ion beam for removing the bucky-ends of said carbon nano tubes. This may comprise a removal, i.e. cut-off, of the bucky-end of a particular nano tube and it may also comprise a zapping of a particular nano tube performed by ion beam bombardment of the respective nano tube. In these cases, the ion beamlet is to be applied very precisely, which is, most desirably, be performed by use of a control of the beams according to the features according to the invention.

It is advantageous that the ion beam irradiates from a direction which is substantially not parallel to the respective nano tube. Further, it is preferable that carbon nano tubes are opened by an ion beam in longitudinal direction after the synthesis of said CNTs when further processing of said CNTs is desired. In this regard, it is advantageous that similar conditions to the conditions applied when performing decapping of carbon nano tube according to the invention are applied. Opening of nano tubes may be understood by using the ion beam as cutting means in order to provide separation of carbon nano tubes. In this regard, it has again to be pointed out that a precise guidance, i.e. control, is important in order to achieve the desired results. Further processing of said nano tubes may comprise modifying or altering the physical structure of the respective nano tube including their physical, chemical and/or conductive properties.

Another preferred feature of the invention comprises an elongation of already grown carbon nano tubes. This is performed by fusion of one CNT with another carbon nano tube by the use of ion beam. The ion beam causes a defined point of a nano tube to be made available in order provide a subsequent connection, i.e. fusion, with a further nano tube.

In correspondence to this it is advantageous that the elongation is carried out by heating the catalytically active particles in the fusion area between two carbon nano tubes by an ion beam. Here again, the performance of such fusion may be carried out very precisely, preferably be the use of guiding means and a demagnifying ion optical system with a determined demagnication factor, according to the invention.

In addition, it is advantageous when elongation is carried out by depositing catalytically active particles in the fusion area between two CNTs by an ion beam. The deposition of catalytically active particles will provide the growing together of carbon nano tubes resulting in an elongated nano tube. A deposition of said catalytically active particle may be performed by an alternative feature according to the invention which may include the application of a stencil mask.

A further preferable feature according to the invention is providing an analysis of carbon nano tubes performed by ion beam. It provides the control of the size and direction of growth of CNTs. Generally, it is known that carbon nano tubes are growing in an arbitrary manner. This characteristic shows the need of providing a control of already grown carbon nano tubes. The results given by the analysis of CNTs by the use of ion beam provides the possibility that even subsequent modifications may be carried out according to one of the above mentioned features according to the invention. Such a modification may include a polarisation by an ion beam or a decapping performed by an ion beam, or even zapping by an ion beam, or fusion of nano tubes by an ion beam, or the like.

When analysis of grown carbon nano tubes is carried out it is advantageous that secondary ions which are re- and/or deflected by said nano tubes, are detected. For this purpose it is preferable that analysis is performed with the presence of noble gas. Further, it is favourable that a control means, preferably in form of a stencil mask and a demgnifying ion optical system is applied.

In order to gain a favourable result according to the aspects of the present invention, it is advantageous that ion beams are generally used with an energy from 10 keV to 300 keV, preferably from 40 keV to 100 keV. Depending on the way in which carbon nano tubes are to be synthesised according to the invention corresponding energy ranges are to be applied. It has to be understood that the application of each energy range has to be carried out in correspondence of the kind of ions constituting the ion beam are used.

Similarly, it is advantageous that the methods are performed at a temperature range of 200° C. to 1000° C., preferably 400° C. to 700° C.

BRIEF DESCRIPTION OF THE SEVERAL VIEWS OF THE DRAWINGS

In the following the method according to the invention is described in more detail in the enclosed drawings, whereby.

DETAILED DESCRIPTION OF THE INVENTION

Figure 1A:
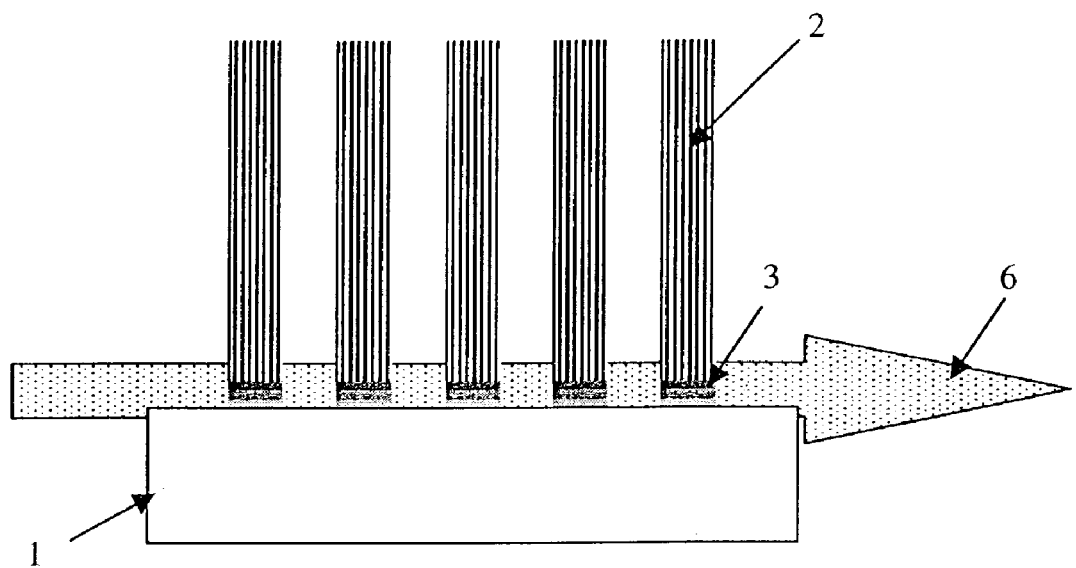
FIGS. 1a and 1b show the formation of carbon nano tubes, whereby ion beam induces deposition of a metal catalyst.
Figure 1B:
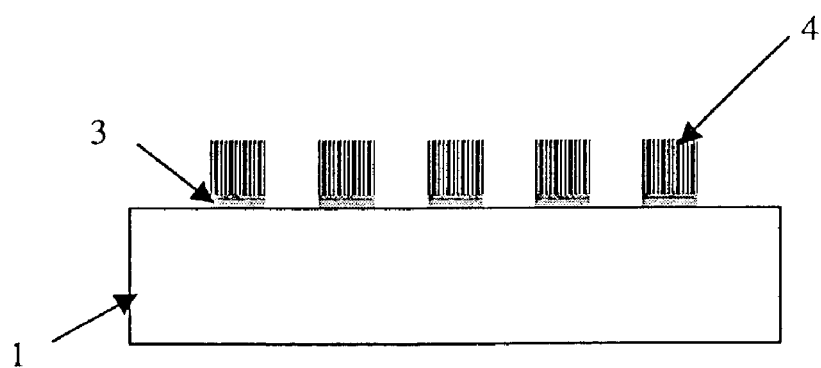

FIGS. 1a and 1b show a first preferred embodiment according to the invention in which prior to the formation of carbon nano tubes a catalyst layer is formed from a gaseous phase comprising catalysts and deposited on the support member by the use of ion beam. In particular, in FIG. 1a an organometallic gas 6 is injected forming a jet above the support member 1. Controlled ion beams 2 are pointing towards the support member 1. When the controlled beams 2 comprising $Ar^+$-ions are crossing the gas jet 6 comprising preferably Ni, Co or Fe particles, the ion beams 2 induce decomposition of the gas 6 due to the collision with the metal particles. Tear shaped catalytically active metal particles 3 are formed which are immediately deposited on the surface of the support member 1. According to FIG. 1a the surface of a support member 1 is not entirely coated with the catalytically active particles 3. A precise placement of the particles 3 is conducted by the ion beam 2. The exact position may be defined by a controller (not shown), such as an electronically controlled beam source emitting said beam, an ion beam comprising a plurality of sub-beams controlled by multi-beam ion optical system, for guiding or directing the beams 2. Defining the positions or local areas provides a controlled growth of nano tubes 4 (which is shown in FIG. 1b), which is the vertical alignment of CNTs 4. In order to provide the desired ion beam induction appropriate conditions are to be applied. Such conditions may be energy ranges from 10 keV to 300 keV and temperature ranges from 200° C. to 1000° C., depending on the kind of ion used.

The CNTs 4 may generally be synthesised in various manners, preferably by vapor deposition of carbon from a gaseous phase immediately after deposition of the catalytically active particle 3 by the ion beams.

Figure 2A:
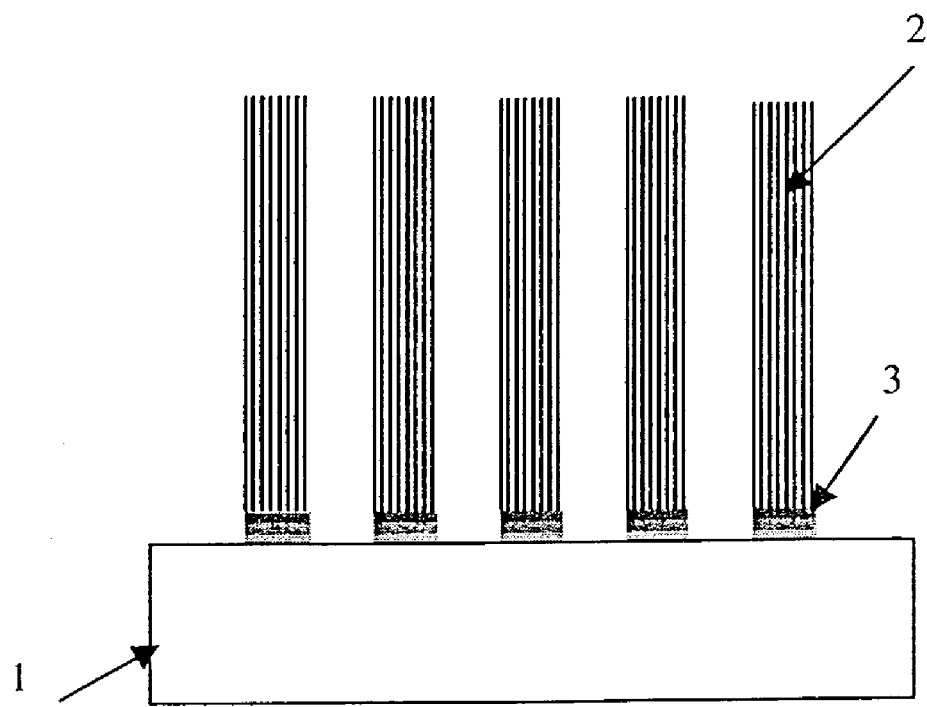
FIGS. 2a and 2b show the formation of carbon nano tubes whereby ion beam is used for direct deposition of the catalyst.
Figure 2B:
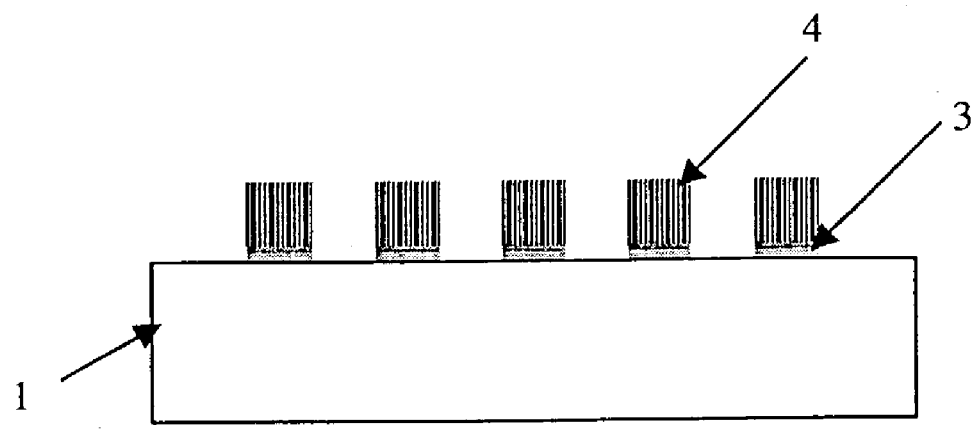

FIGS. 2a and 2b illustrate a second preferred embodiment according to the invention in which ion beams 2 are used prior to the synthesis of carbon nano tubes (not shown) and metal ion direct deposition of metal catalysts 3 is carried out. Ion beams 2 comprising metal catalytic material, preferably Co, Ni, and/or Fe-ions, are coming into contact with the surface of the support member 1 and are directly placed thereon. In this case the beam source is emitting said metal ion beams. A preferred guidance of such beams 2 in order to define an exact position of the placement of the particles 3 is preferably conducted by an electronic controller (not shown) controlling such beam source. The subsequent growth of CNTs 4 by the catalytical active particles is shown in FIG. 2b. According to this present embodiment of FIG. 2b the nano tubes 4 are preferably vapor grown carbon nano tubes.

Carrying out metal ion direct deposition of metal catalysts onto the surface of the support member 1 by ion beam may also be performed in relation to already synthesised carbon nano tubes irrespective of the stage of synthesis.

Figure 3A:
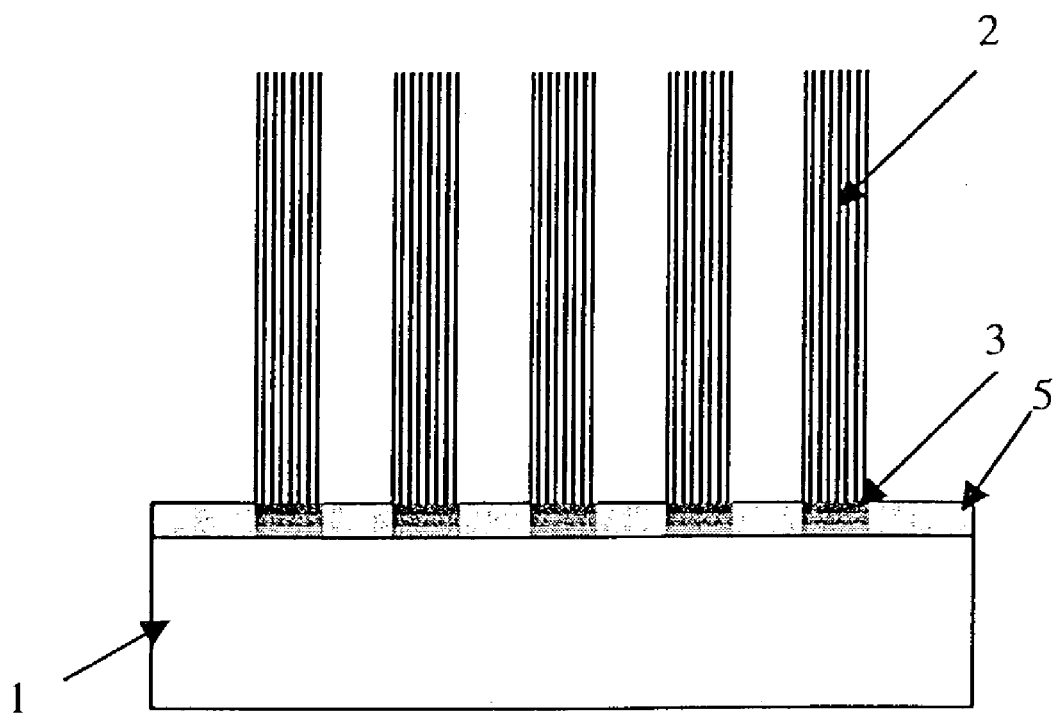
FIGS. 3a and 3b illustrate the formation of carbon nano tubes whereby ion beam is used for inducing activation of a catalyst layer.
Figure 3B:
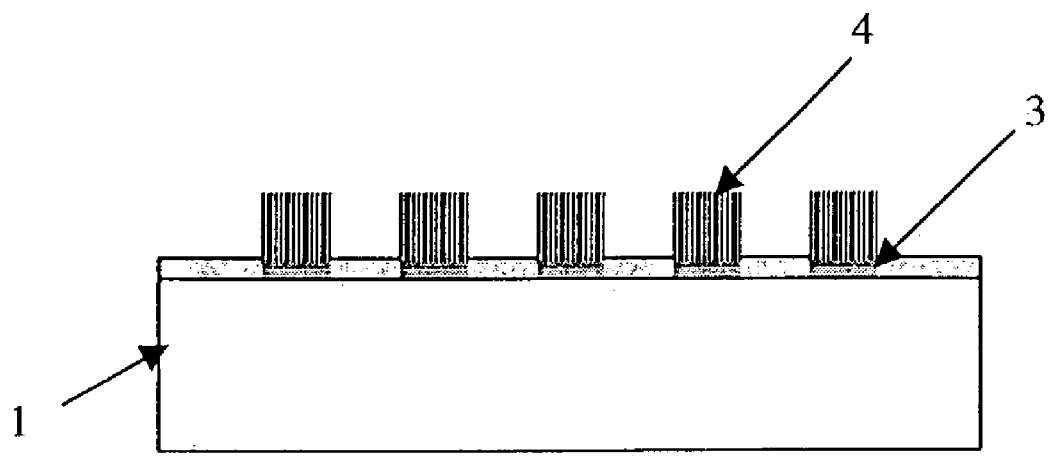

In FIGS. 3a and 3b, in which another preferred embodiment according to the invention is illustrated, the support member 1 is coated with a catalyst layer comprising an oxidised metal catalyst 5. Carrying out beam induction according to the embodiment in FIGS. 3a and 3b provides modification of the catalyst layer 5 induced by ion beam 2.

Particularly, FIG. 3a the oxidised metal layer 5 covering the surface of the support member 1 contains metal particles, preferably Fe—, Ni—, Co or mixtures thereof, in a catalytically inactive form. Ion beams comprising $H^+$-ions bombard said catalyst layer thereby inducing reduction of the oxidised layer. The depths of impact cause different stages of reduction which is indicated in different shades of grey in FIG. 3a.

FIG. 3b shows vapor grown isolated carbon nano tubes at the correspondent positions where the beams 3 induced reduction, i.e. activation, of the catalyst layer 5. As mentioned in the first and second preferred embodiment according to the invention, the beams are preferably controlled in order to define an exact position on the support member. For this purpose a controller may be selected either a mask and a demagnifying ion optical system may be applied or the use of an electronically controlled beam source emitting the beams. The ion beam also may comprise a plurality of sub-beams in which case the controller comprises a multi-beam ion optical system. Applying such conditions, desired final patterns of vertically aligned nano tubes may be obtained by ion beam induction.

Figure 4A:
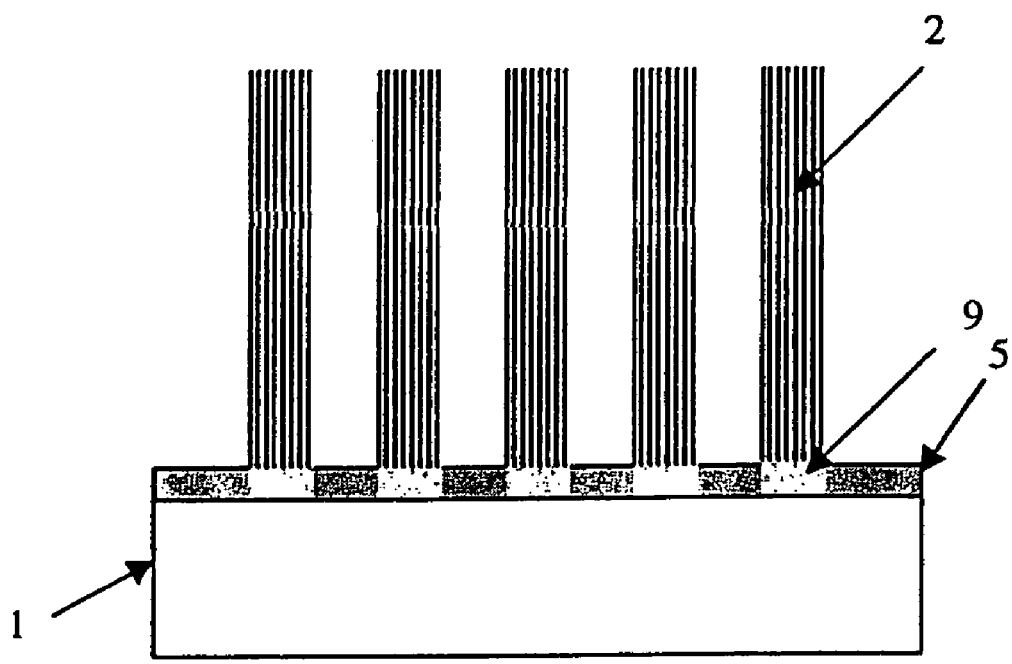
FIGS. 4a and 4b show the formation of carbon nano tubes whereby ion beam is used for inducing inactivation of a catalyst.
Figure 4B:
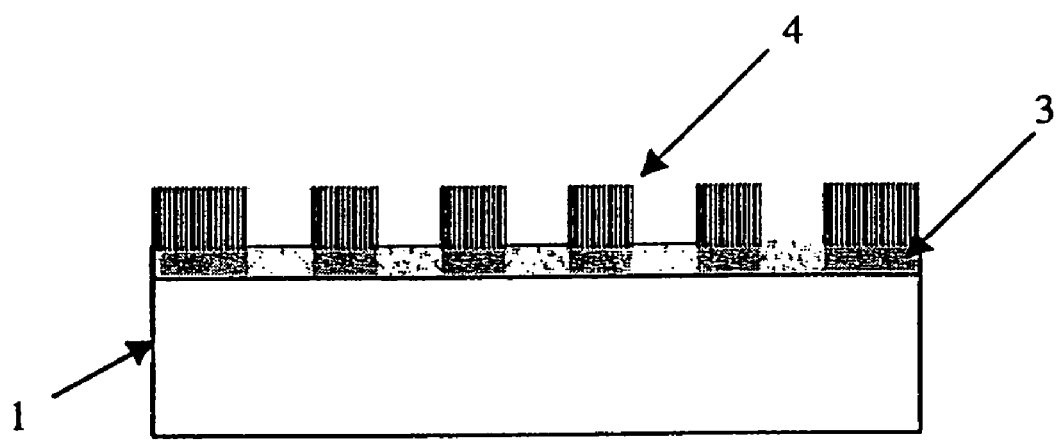

FIGS. 4a and 4b illustrate the use of ion beam for modifying a catalyst layer 5 in such a way that a negative image is obtained on which carbon nano tubes 4 are then grown. The present embodiment according to the invention relates to a partial inactivation of an existing catalyst layer by ion beams. In particular, the catalytic activity of the catalyst layer 5 is at least partially decreased by an ion beam 2 and carbon nano tubes 4 are then grown on the remaining catalytically active centres 3 of the catalyst layer 5. FIG. 4a shows the support member 1 which is coated with a metal catalyst layer 5. Ion beam 2 which comprise $O_2^+$-ions irradiate said layer 5 and oxidation of the bombarded areas 9 of the metal catalyst layer 5 is caused. The effect is inactivation of the catalytic activity of said areas which results in that carbon nano tubes may be grown in-between these areas where inactivation has not taken place, which result is given in FIG. 4b. Here, vapor grown carbon nano tubes 4 are synthesised in a controlled vertically alignment.

In order to provide precise placement of the ion beamlet, conditions relating to a control, i.e. guidance, of the beams already mentioned with regard to the previous embodiments may be applied. This also comprise the application of defined energy and temperature ranges in accordance of the kind of ions used. Applying various conditions may provide different results of the modification of the catalytical activity and the subsequent growth of CNT; either a desired inactivation of bombarded zones of the catalyst or, if desired, even a destruction (see embodiment in FIG. 3).

Figure 5A:
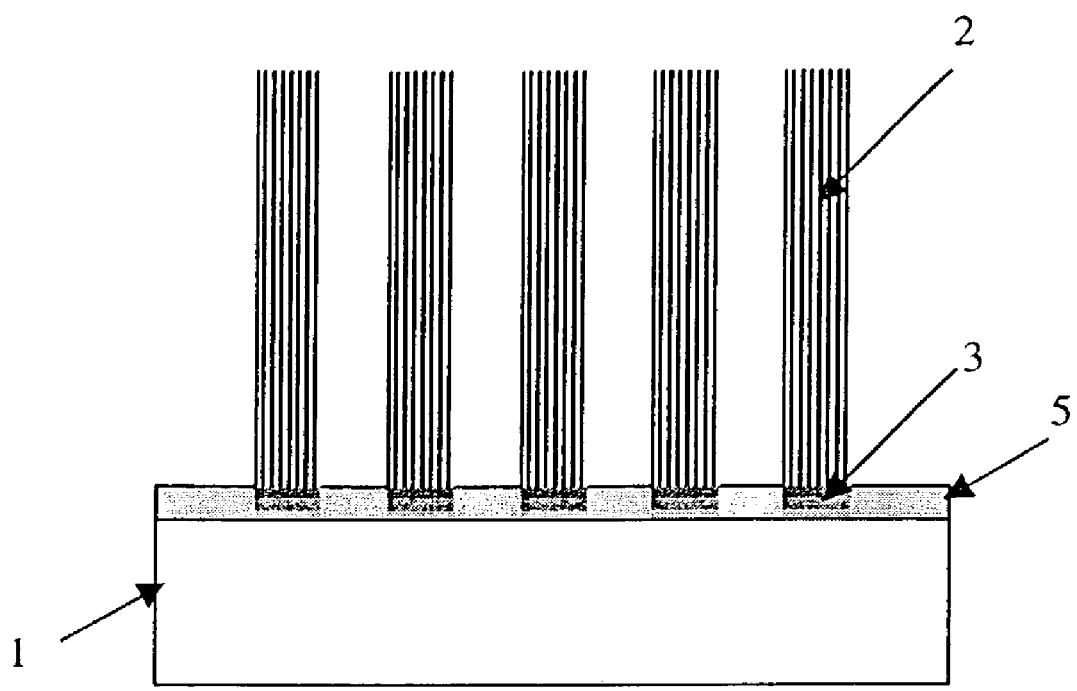
FIGS. 5a and 5b illustrate the formation of carbon nano tubes whereby ion beam is used for inducing enhancement of a catalyst layer.
Figure 5B:
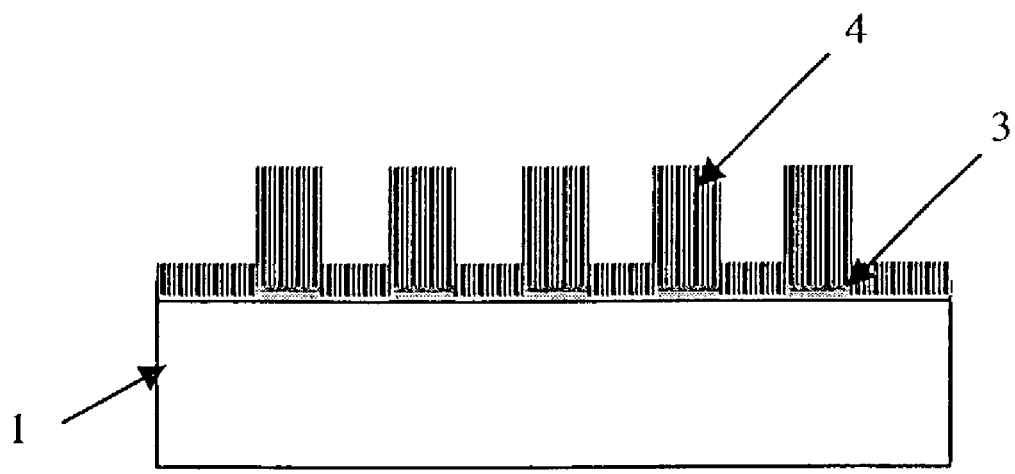

In FIGS. 5a and 5b a further embodiment according to the invention is illustrated which shows an ion beam 2 induced enhancement of the catalyst layer 5. In the present case, beamlets 2 comprising $H^+$-ions are inducing modification of the surface of the layer 5. The effect of bombardment by hydrogen beams 2 on the catalyst 5 is an enhancement of the catalytical activity of the affected areas 3. Due to oxidation of irradiated zones by the $H^+$-ion beams an increased growth of carbon nano tubes 2 may then be attained at these positions. Since catalytic activity is still present in the remaining non-bombarded areas, nano tubes 2 may be developed thereon as well. The result is shown in FIG. 5b. For enhancing a catalyst layer 5 it is most preferable that an atmosphere comprising acetylene gas, a temperature range from 500 to 600 and an energy range from 50 keV to 70 keV is applied. As it can be seen in FIG. 5b, when applying such preferred conditions it may be observed that a defined improvement of the controlled synthesis of CNTs may be attained. It may be noted that when enhancement of the catalytical properties of an existing layer is carried out, the energy and temperature ranges are to be applied in accordance with the properties of the particular chemical element selected and used for the beam induction.

The definition of the affected areas 3 on the catalyst layer 5 in FIGS. 5a and 5b may again be obtained by way of control as already described in the previous embodiments.

Performing the method according to the present preferred embodiment means, in correspondence to the embodiments illustrated in FIGS. 1 to 4, the arbitrary growth of nano tubes may be avoided by the use of ion beam induction and controlled substantially vertically aligned carbon nano tubes can be synthesised.

Figure 6A:
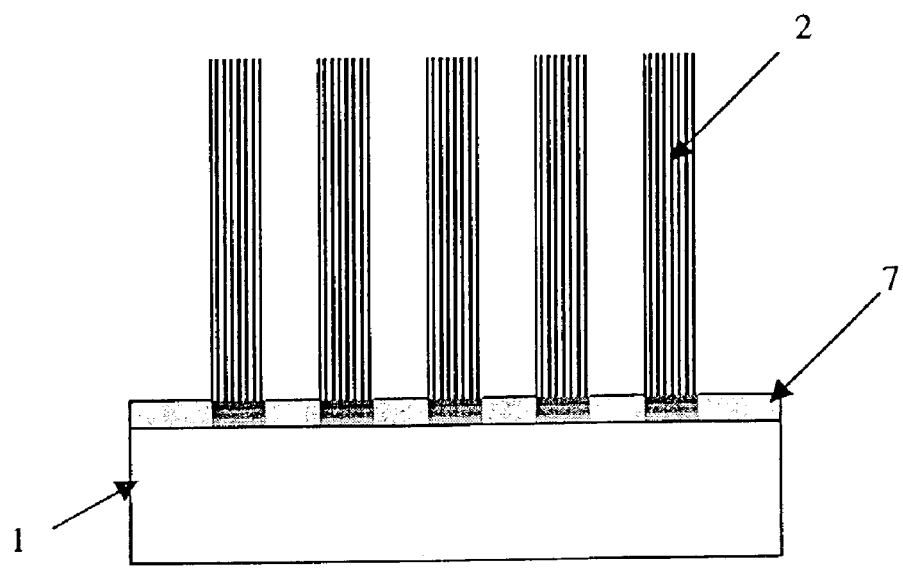
FIGS. 6a and 6b show the formation of carbon nano tubes whereby ion beam is used for inducing modification of a catalytically non-active layer coating a catalyst.
Figure 6B:
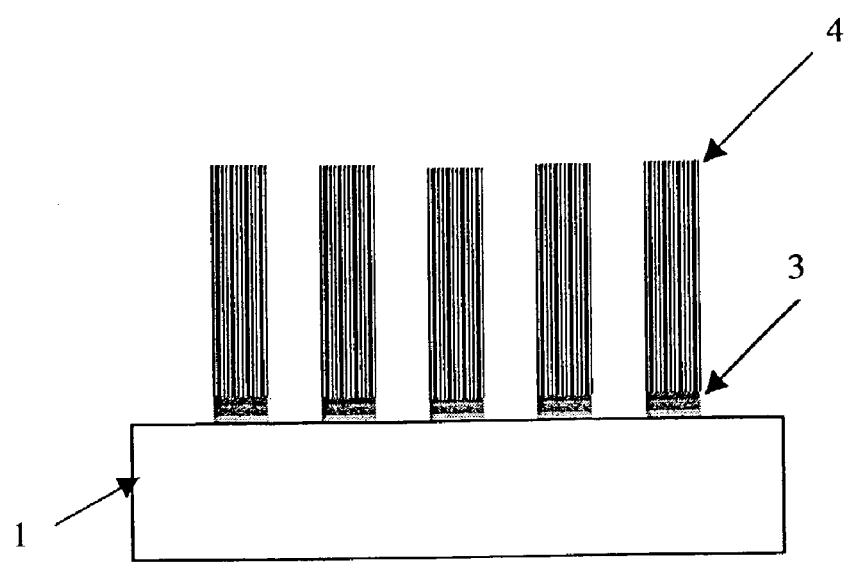

A further preferred embodiment according to the present invention is illustrated in FIGS. 6a and 6b. The support member 1 is coated with a nano tube enhanced polymer layer 7. Hence, said layer 7 comprises non-active catalytic particles which are coated by polymer material—a nano tube composite. Controlled hydrogen beams 2 are applied for bombardment to induce activation of said particles 3 by destruction and/or removal of the irradiated areas of said polymer layer 7. Due to the requirement of performing precise targeting of the layer 7 and, eventually forming a determined pattern on said layer 7, induced by the ion beams 2 it is most desirable to use a controller, for instance a stencil mask (not shown) having a predetermined pattern of structure openings. Additionally, a demagnifying ion optical system (also not shown) is preferably applied. However, it may well be that for guiding the beams an electronically controlled beam source emitting said beams is used. After the polymer layer 7 being subjected to activation by ion beams postexposure development allows the subsequent growth of carbon nano tubes 4.

Figure 7A:
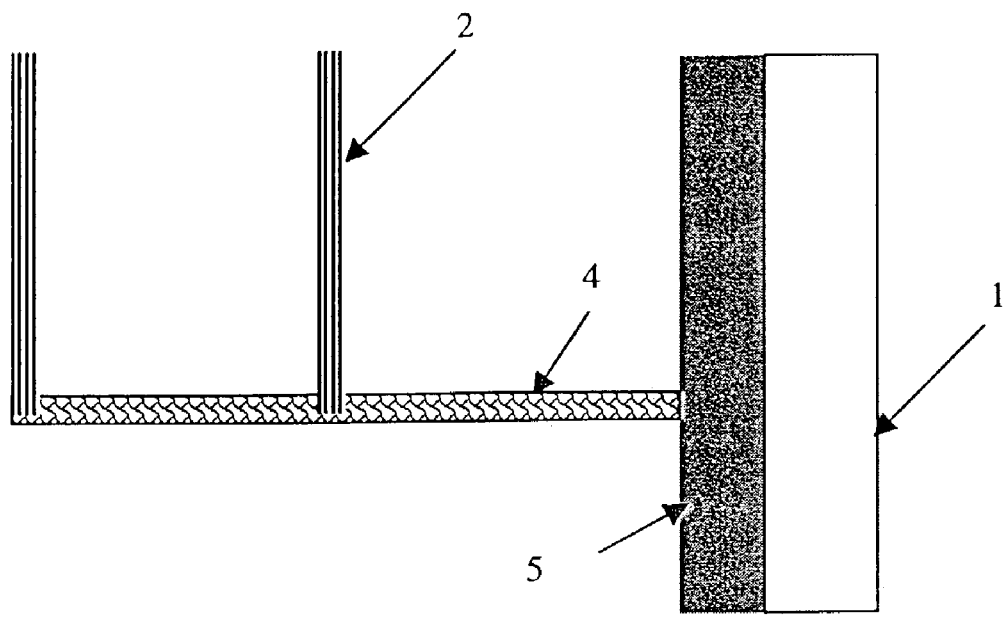
FIGS. 7a and 7b show grown carbon nano tubes whereby ion beam is used for modification.
Figure 7B:
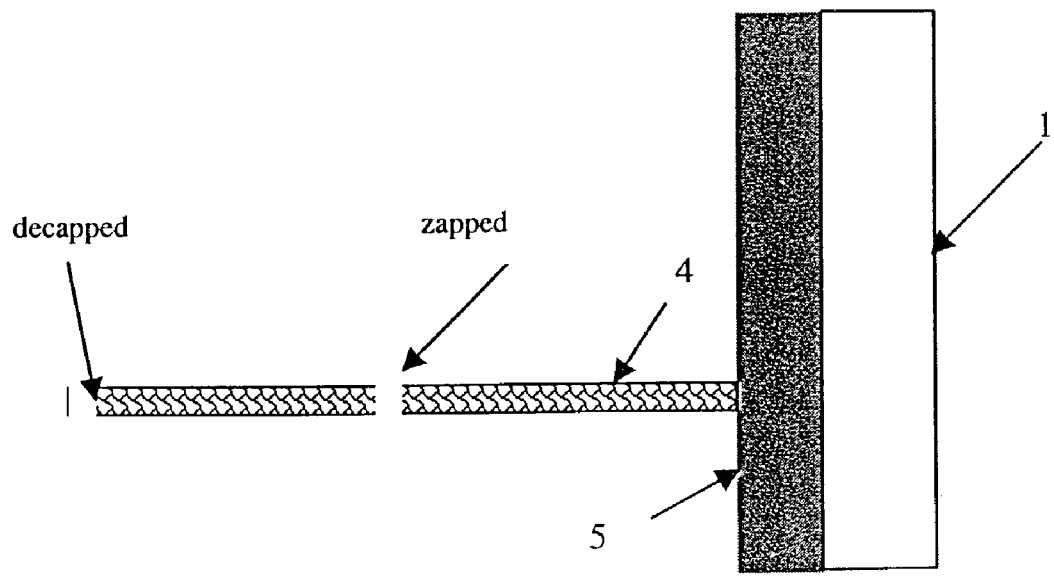

The embodiment described in FIG. 7 illustrates the ion beam induced decapping of a nano tube for removing the bucky-ends of said nano tube. In particular, FIG. 7a shows the nano tube 4 synthesised on a catalyst layer 5. An ion beamlet 2 bombards said nano tube from a direction transverse to the longitudinal axes of the nano tube 4. The first (left) ion beamlet 2 is precisely positioned in order to meet the bucky-end of the nano tube. For this purpose, again, the application of a controller is important to provide exact guidance of said ion beamlet. As shown in FIG. 7b the first ion beamlet 2 (not shown) has induced decapping of the bucky-end of said nano tube which is indicated in a vertical small line. The second ion beamlet 2 in FIG. 7a points to the centre of the nano tube 4. Zapping of the nano tube 4 is caused, which can be seen in FIG. 7b where said nano tube is interrupted or set apart. Similar to the guidance of the first beamlet 2 a controller for the second beamlet 2 is applicable. Generally, the purpose of decapping and/or zapping is the preparation of the treated nano tube 4 for further processing. This may include an elongation of nano tubes by fusion with another nano tube.

Zapping of nano tubes may well be possible in the longitudinal direction of a nano tube which might also be desired for further processing. An $Ar^+$-ion beam is applicable to induce zapping which leads to the division of the CNT. Thus, the two halves of the nano tube may be subjected to doping by a different ion beam for the purpose of inducing semi-conductive properties of the affected CNT. For instance phosphor is directly implanted by the ion beam, in which case an electronically controlled beam source emitting ion beams including P is a simple way of control and said ion may be positioned exactly, e.g. on the end of the zapped nano tube. Similar, direct deposition of such a contaminating foreign ions may be performed in relation to decapped nano tubes.

Figure 8A:
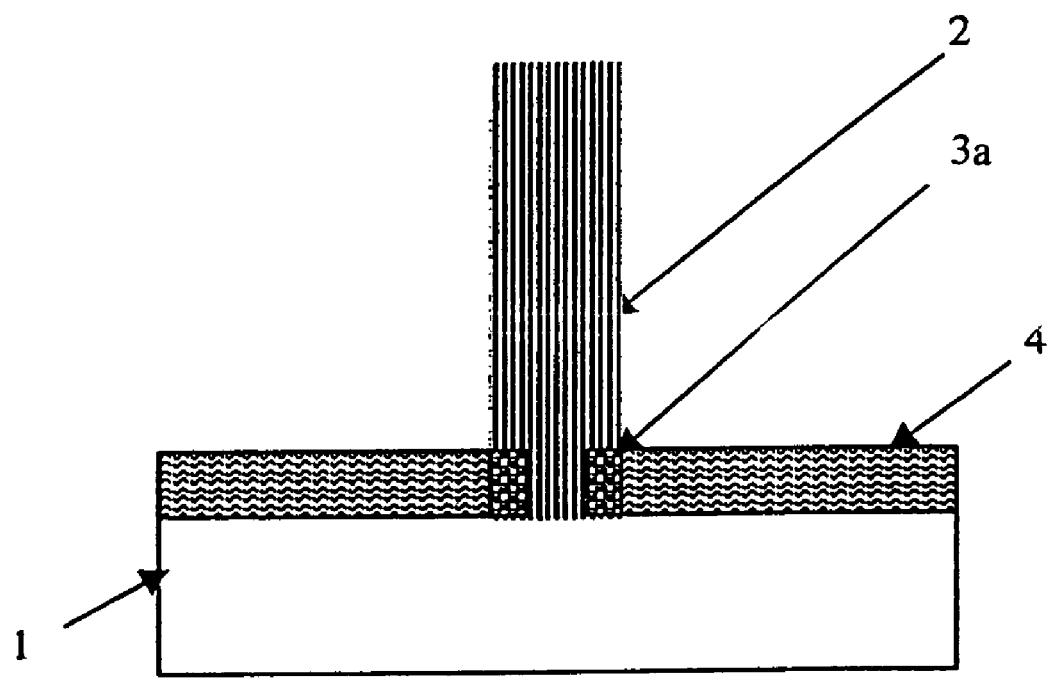
FIGS. 8a and 8b illustrate carbon nano tubes whereby ion beam is used to induce elongation.
Figure 8B:
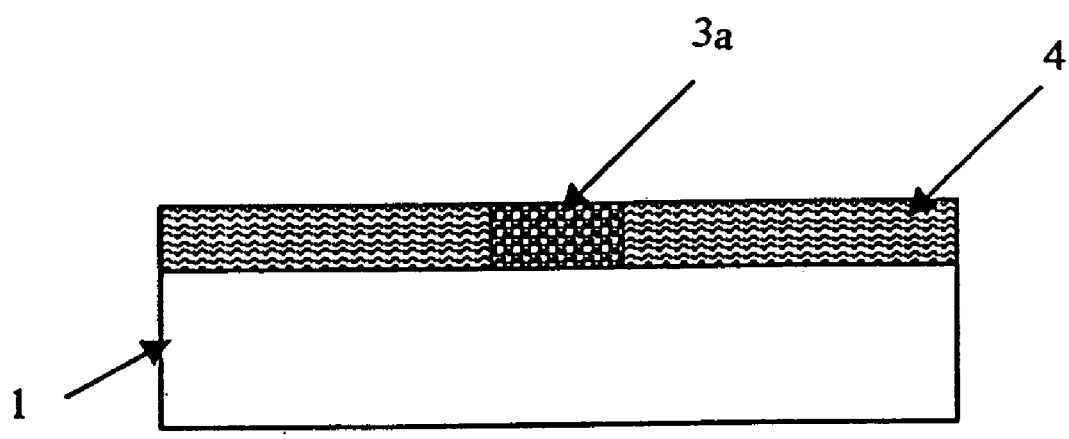

Another preferred embodiment according to the invention is explained in more detail in FIG. 8. It relates to an illustration of an ion beam induced heating of nano tubes which may also be subjected to further processing. In FIG. 8a two carbon nano tubes 4 grown along the surface of said support member 1 whereby their ends with the catalytic cap 3a are pointing towards each other. The CNTs may be grown in accordance to the features of the invention, which is performing direct ion deposition, ion induced deposition or similar features. Additionally, they may be modified in accordance to a feature of the present invention, which includes a polarisation of the surrounding surface of a CNT in order to change their direction of growth. The catalyst ends 3a of a CNT in FIG. 8a which include the bucky-ends of nano tubes, may comprise catalytically active particles including either Ni, Co, Fe-ions or combinations thereof. An ion beamlet 2 with H$^+$-ion irradiates said caps 3a of said nano tubes 4. Here again, the control of said ion beam is an important aspect, which may be applicable in accordance to the previous described embodiments. In FIG. 8a the hydrogen beam induces reduction of the catalyst cap 3a of the nano tubes 4. The beams also causes heating of the particular caps 3a leading to further growth of the two respective ends of said nano tubes 4. Following this process, further processing of treated CNTs is provided. According to this embodiment a welded nano tube 4 is prepared under vapourous conditions, which is shown in FIG. 8b. Thus, elongation of nano tubes induced by ion beam, in particular the fusion of respective ends, is provided. Favourable results are also gained when the embodiment illustrated in FIG. 8 is carried out in the presence of Xe-beams.

Figure 9A:
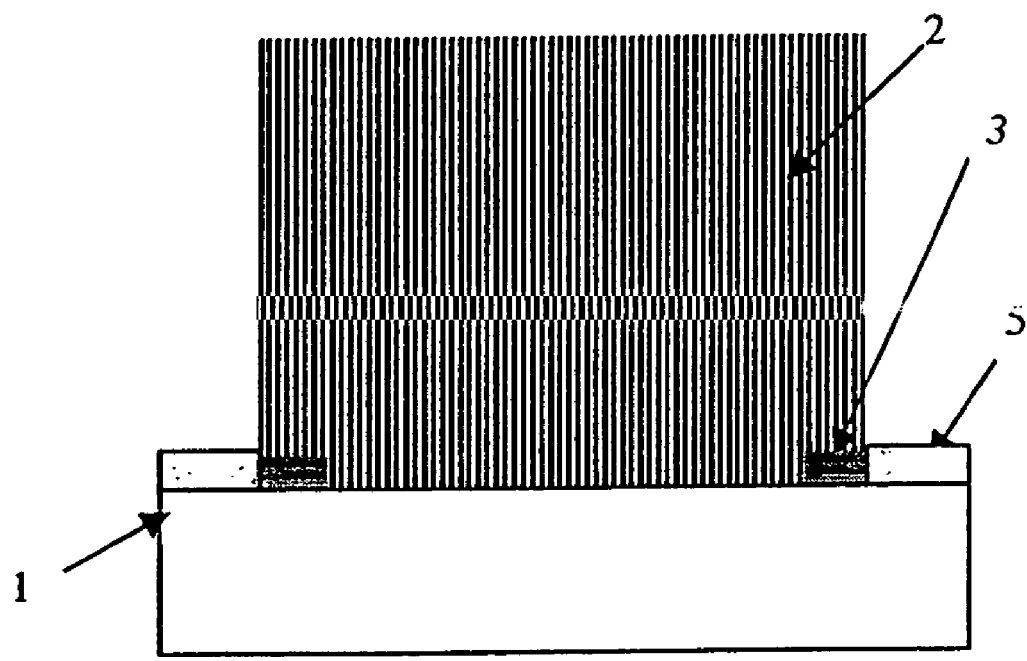
FIGS. 9a and 9b show carbon nano tubes whereby ion beam is used to induce horizontal growth.
Figure 9B:
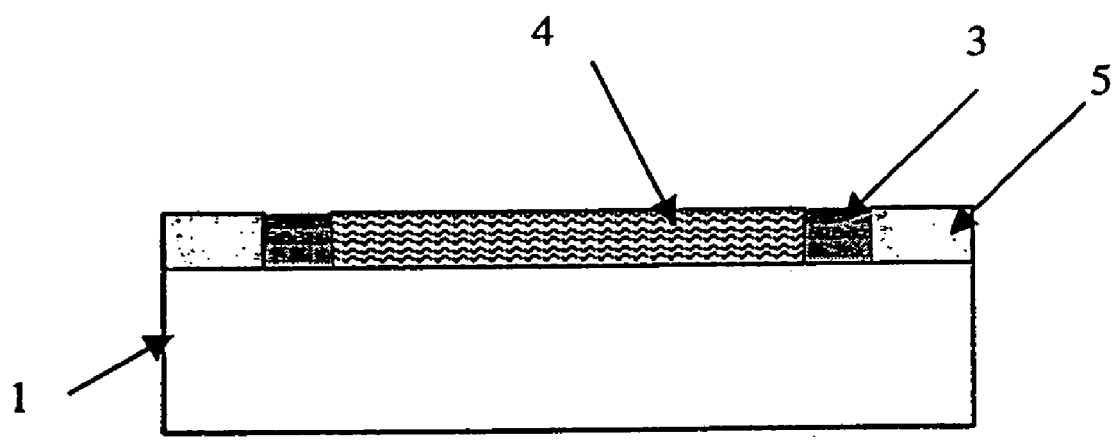

FIG. 9 provides another preferred embodiment according to the invention illustrating an ion beam induction for horizontal growth of nano tubes. In particular, FIG. 9a shows a catalyst layer 5 on the left side of the support member 1 and a second catalyst layer 5 on the right side of the support member 1, both being oxidised catalysts. Ion beams 2, in particular a broad band of ion beamlets comprising H$^+$-ions, induce reduction of the oxidised metal catalyst 5. It can be observed in FIG. 9a and FIG. 9b that the reduced areas 3 of the layer 5 induced by the bombardment result in activation of the catalytical activity in the particular areas 3. FIG. 9b illustrates the effect of ion beam induction according to FIG. 9a which is the formation of a horizontal growth of a nano tube 4. In particular, vapor grown carbon nano tubes 4 are able to develop between said reduced areas of the layers 5. Performing the method according to the invention in correspondence to the preferred embodiment just described provides an appreciable control of the direction of growth of carbon nano tubes. Such a control may not only be limited to the embodiment according to FIG. 9. Thus, it may well be that grown carbon nano tubes are subjected to such beam induction leading to the change in the direction of the further growth.

Figure 10A:
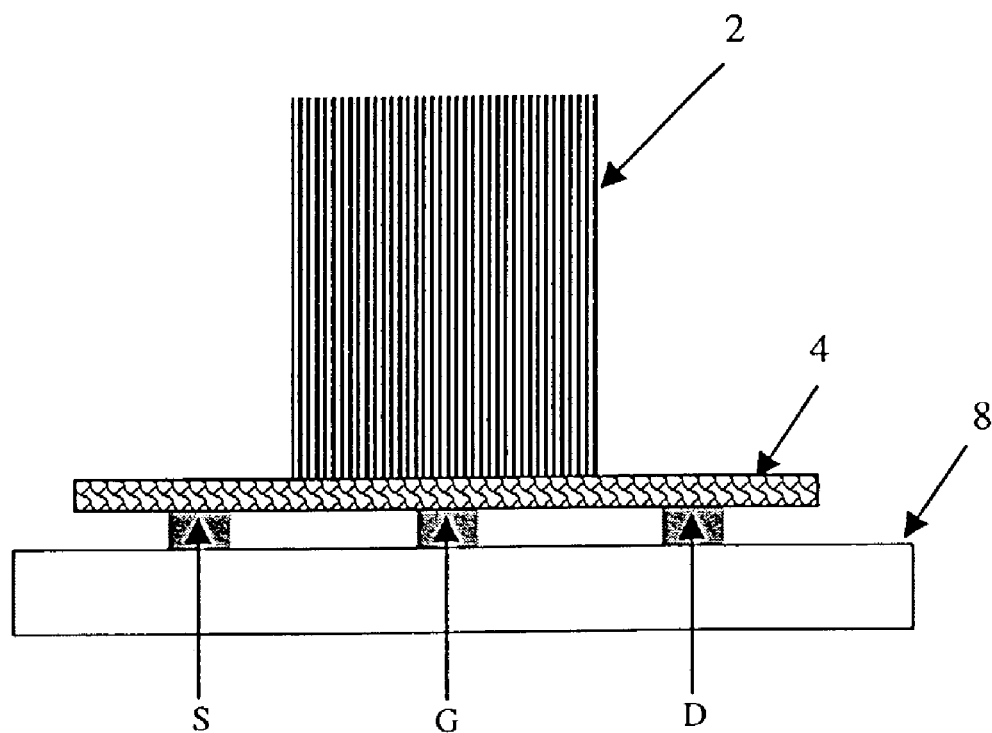
FIG. 10a and 10b is a sectional view of a nano tube transistor whereby ion beam is used to induce doping or destruction thereof.
Figure 10B:
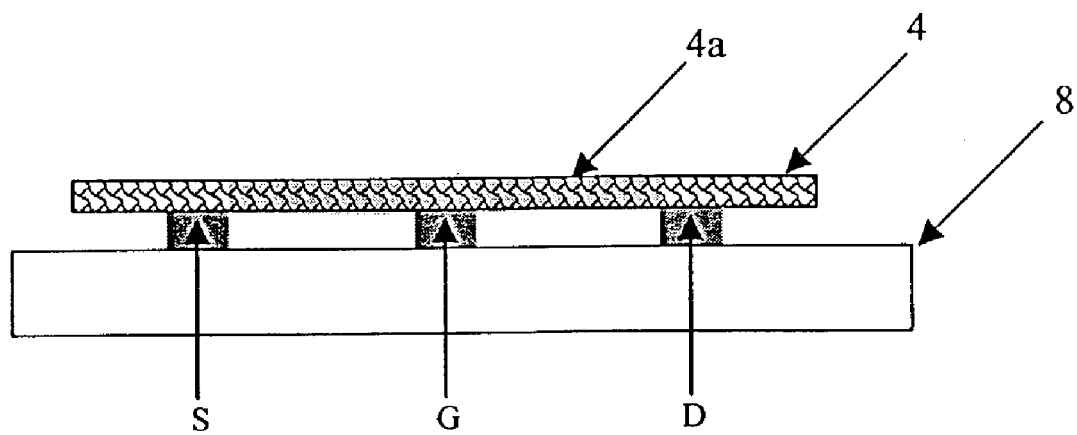

FIGS. 10a and 10b provide a preferred embodiment according to the invention which shows another application of the method using ion beams. Here, a transistor is realised by a carbon nano tube whereby ion beam induction is applied in order to perform doping of defined areas of said carbon nano tube. For this purpose any CNTs may be supplied as well as nano tubes which are grown in accordance to one of the embodiments described above. A carbon nano tube transistor is shown in sectional view. In particular, in FIG. 10a a base 8, preferably a silicon base, provides the contacts (source S, gate G and drain D) of the transistor which constitutes the nano tube 4. An ion beamlet 2 comprising any of the particles which are advantageous to use for doping, i.e. depletion, is pointing towards the nano tube 4, which is the opposite side of the contacts. When the ion beamlet 2 is coming into contact with said tube 4 a depletion zone 4a is induced which is indicated in a grey shaded zone of the nano tube 4 in FIG. 10b. The formation of such zones having different conductivity may be performed by one of the above described features according to the invention which is, preferably, ion deposition or ion induced deposition. Desirably, ion deposition is performed for the formation of the depletion zone 4a due to the simple realisation of direct implantation of foreign ions. Generally, such foreign ions may comprise germanium or any other element commonly used in the field of transistor production. According to the present embodiment, elements selected from the group preferably consisting of As, P, B, Ag, Au, Pt, Pd may be used in order to form depletion zones.

The ion beam 2 is guided, preferably by the use of a stencil mask (not shown) whereby a demagnifying ion optical system (not shown) with a demagnification factor between 4 to 400 is applied. Alternatively, an electronically controlled beam source may be used.

In FIG. 10b the nano tube transistor 4 realised according to the invention is shown. The semiconductive properties are induced by the ion beam in correspondence with the application of the conditions according to the invention, namely the control means, defined energy and temperature ranges. It may well be that the ion beam 2 induces depletion of the zone 4a of the nano tube transistor 4 which affects the semiconductive properties of the nano tube 4. Hence, it is possible that arrays of nano tube tranistors showing different conductive properties may be obtained. If the gate-contact G of the transistor is equipped with an isolating material a field-effect transistor may be realised.

The invention claimed is:

1. A method of synthesizing carbon nano tubes (CNTs) the method comprising:
   catalytically depositing carbon from a gaseous phase to form or synthesize CNTs on a catalyst layer formed on a support member,
   using an ion beam with an energy from 10 keV to 100 keV and having a plurality of sub-beams prior to, during and after formation of said carbon nano tubes to modify properties selected from the group consisting of physical, chemical and conductive properties of the carbon nano tubes, and
   controlling the plurality of sub-beams by a multi-beam ion optical system.

2. The method according to claim 1, wherein the catalyst layer has a thickness in the range of 10 nm to 500 nm.

3. The method according to claim 1, wherein the ion beam is guided by a diverting member or a focusing member.

4. The method according to claim 1, wherein the ion beam is controlled by use of a stencil mask.

5. The method according to claim 4, wherein a demagnifying ion optical system with a demagnification factor between 4 and 400 is used.

6. The method according to claim 1, wherein the method is performed at a temperature range of 200° C. to 1000° C.

7. The method according to claim 1, wherein a controller is electronically controlling a beam source emitting said ion beam.

8. The method according to claim 1, wherein the ion beam comprises particles selected from the group consisting of catalytically active particles, Co, Ni, Fe; gases, He, H, Ar, Xe, Kr, O; and doping agents As, P, B, Ag, Au, Pt, Pd, as well as mixture thereof.

9. The method according to claim 1, wherein the catalyst layer comprises a metal catalyst layer.

10. The method according to claim 1, wherein prior to formation of said CNTs, the catalyst layer is deposited on the support member by ion beam deposition and CNTs are then grown on aid catalyst layer.

11. The method according to claim 1, wherein prior to formation of said CNTs, the catalyst layer is formed from a gaseous phase comprising catalyst particles, and deposited on the support member by controlled ion beam induction and CNTs are then grown on said catalyst layer.

12. The method according to claim 1, wherein prior to formation of said CNTs, the catalytic activity of the catalyst layer is at least partially enhanced by an ion beam and CNTs are then grown on active centers of the catalyst layer.

13. The method according to claim 1, wherein prior to formation of said CNTs, the catalytic activity of the catalyst layer is at least partially decreased by an ion beam and CNTs are then grown on active centers of the catalyst layer.

14. The method according to claim 1, wherein prior to formation of said CNTs, the catalyst layer is at least partially activated by an ion beam and CNTs are then grown on He active centers of the catalyst layer.

15. The method according to claim 1, wherein the catalyst layer comprises an oxidised metal catalyst, which is at least partially reduced and activated by a beam comprising $H^+$-ions and CNTs are then grown on sad active centers of said catalyst layer.

16. The method according to claim 1, wherein the an active catalyst is coated with a non-active material, which is prior to formation of said CNTs at least partially removed by an ion beam and CNTs are then grown on active centers of said catalyst.

17. The method according to claim 1, wherein prior to formation of said CNTs the catalyst layer is partially deactivated by an ion beam and CNTs are then grown on remaining active centers of said catalyst layer.

18. The method according to claim 17, wherein the catalyst layer comprises active metal catalyst, which is partially oxidised and deactivated by a beam comprising $O^{2+}$-ions and CNTs are then grown on the remaining active centers of said catalyst layer.

19. The method according to claim 1, wherein during formation the direction of growth of said CNTs is influenced by partial polarisation of the surrounding surface by an ion beam.

20. The method according to claim 1, wherein after formation said CNTs are doped by an ion beam for exploiting semiconductor properties.

21. The method according to claim 1, wherein after formation said CNTs are milled by an ion beam for controlling the thickness of the walls of said CNTs.

22. The method according to claim 1, wherein after formation said CNTs are decapped by an ion beam for removing the bucky-ends of said CNTs.

23. The method according to claim 1, wherein after formation said CNTs are opened by an ion beam in longitudinal direction for further processing of said CNTs.

24. The method according to claim 1, wherein after formation said CNTs are elongated with further CNTs by fusion with an ion beam.

25. The method according to claim 24, wherein the elongation is carried out by heating catalytically active particles in the fusion area between two CNTs by an ion beam.

26. The method according to claim 24, wherein the elongation is carried out by depositing catalytically active particles in the fusion area between two CNTs by an ion beam.

27. The method according to claim 1, wherein after formation said CNTs are analyzed by an ion beam.

28. The method according to claim 27, wherein the analysis is carried out by detecting secondary ions reflected or deflected by said CNTs.

* * * * *